(12) United States Patent
Naito et al.

(10) Patent No.: US 8,351,743 B2
(45) Date of Patent: *Jan. 8, 2013

(54) SUSPENSION BOARD WITH CIRCUIT AND PRODUCING METHOD THEREOF

(75) Inventors: Toshiki Naito, Osaka (JP); Jun Ishii, Osaka (JP)

(73) Assignee: Nitto Denko Corporation, Osaka (JP)

( * ) Notice: Subject to any disclaimer, the term of this patent is extended or adjusted under 35 U.S.C. 154(b) by 261 days.

This patent is subject to a terminal disclaimer.

(21) Appl. No.: 12/458,223

(22) Filed: Jul. 6, 2009

(65) Prior Publication Data

US 2010/0000774 A1 Jan. 7, 2010

Related U.S. Application Data

(60) Provisional application No. 61/129,726, filed on Jul. 15, 2008.

(30) Foreign Application Priority Data

Jul. 7, 2008 (JP) .................................. 2008-177203

(51) Int. Cl.
G02B 6/12 (2006.01)
G02B 6/26 (2006.01)
G02B 6/42 (2006.01)

(52) U.S. Cl. ................. 385/14; 385/15; 385/31; 385/39; 385/49; 385/52; 385/53; 385/88; 385/89; 385/92

(58) Field of Classification Search ...................... 385/14
See application file for complete search history.

(56) References Cited

U.S. PATENT DOCUMENTS

| | | | |
|---|---|---|---|
| 5,189,574 A * | 2/1993 | Imamura et al. | 360/234.2 |
| 5,731,930 A * | 3/1998 | Maggio et al. | 360/264.2 |
| 5,910,012 A | 6/1999 | Takeuchi | |
| 6,016,290 A | 1/2000 | Chen et al. | |
| 7,033,457 B2 * | 4/2006 | Kim et al. | 156/257 |
| 7,106,664 B2 | 9/2006 | Hasegawa et al. | |
| 7,154,820 B2 | 12/2006 | Nakada et al. | |
| 7,787,718 B2 * | 8/2010 | Ishii et al. | 385/14 |
| 2002/0167870 A1 | 11/2002 | Akiyama et al. | |
| 2003/0059151 A1 | 3/2003 | Brist et al. | |
| 2004/0008605 A1 | 1/2004 | Thornton et al. | |
| 2004/0131001 A1 | 7/2004 | Nakada et al. | |
| 2005/0018547 A1 | 1/2005 | Akiyama et al. | |
| 2005/0248885 A1 | 11/2005 | Funada et al. | |
| 2006/0087769 A1 | 4/2006 | Ohsawa et al. | |
| 2006/0120658 A1 | 6/2006 | Naitou | |
| 2006/0133230 A1 | 6/2006 | Buechel et al. | |
| 2006/0187564 A1 | 8/2006 | Sato et al. | |
| 2006/0233061 A1 | 10/2006 | Rausch et al. | |
| 2006/0233062 A1 | 10/2006 | Bedillion et al. | |

(Continued)

FOREIGN PATENT DOCUMENTS

EP 1635624 3/2006

(Continued)

*Primary Examiner* — Ryan Lepisto

(74) *Attorney, Agent, or Firm* — Jean C. Edwards, Esq.; Edwards Neils PLLC

(57) ABSTRACT

A suspension board with circuit includes a metal supporting board; an insulating base layer formed on the metal supporting board; a conductive pattern formed on the insulating base layer; an insulating cover layer formed on the insulating base layer so as to cover the conductive pattern; and an optical waveguide. The optical waveguide is provided on the metal supporting board separately from the insulating base layer, the conductive pattern, and the insulating cover layer.

6 Claims, 7 Drawing Sheets

U.S. PATENT DOCUMENTS

| | | |
|---|---|---|
| 2007/0177302 A1 | 8/2007 | Shimazawa et al. |
| 2007/0242921 A1 | 10/2007 | Matsumoto |
| 2008/0115962 A1 | 5/2008 | Juni et al. |
| 2008/0117727 A1 | 5/2008 | Matsumoto |
| 2008/0130155 A1 | 6/2008 | Naniwa et al. |
| 2008/0205202 A1* | 8/2008 | Komura et al. ............ 369/13.02 |

FOREIGN PATENT DOCUMENTS

| | | |
|---|---|---|
| JP | 08-222830 A | 8/1996 |
| JP | 10-107405 A | 4/1998 |
| JP | 11-150155 A | 6/1999 |
| JP | 2000-195002 | 7/2000 |
| JP | 2007-280572 | 10/2000 |
| JP | 2001-257449 A | 9/2001 |
| JP | 2002-169064 | 6/2002 |
| JP | 2002-298302 | 10/2002 |
| JP | 2005-322336 A | 11/2005 |
| JP | 2005-338287 A | 12/2005 |
| JP | 2006-120288 A | 5/2006 |
| JP | 2006-156439 A | 6/2006 |
| JP | 2006-185548 A | 7/2006 |
| JP | 2006-323908 | 11/2006 |
| JP | 2007-52918 | 3/2007 |
| JP | 2007-094296 | 4/2007 |
| JP | 2007-095167 | 4/2007 |
| JP | 2007-207349 | 8/2007 |
| JP | 2008-122908 A | 5/2008 |
| JP | 2008-124418 A | 5/2008 |
| JP | 2008-130106 | 6/2008 |
| JP | 2008-130165 A | 6/2008 |
| JP | 2008-152899 A | 7/2008 |
| WO | WO 2004/001724 A1 | 12/2003 |

* cited by examiner

FIG. 4
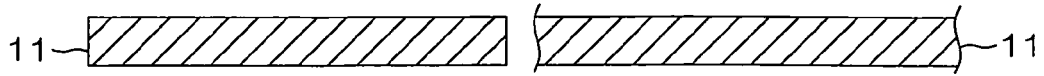
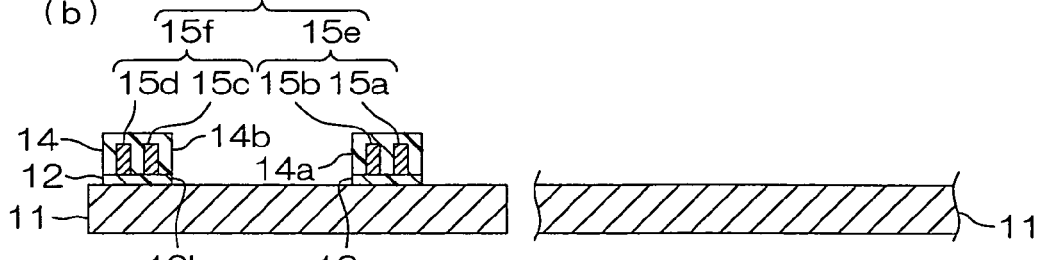
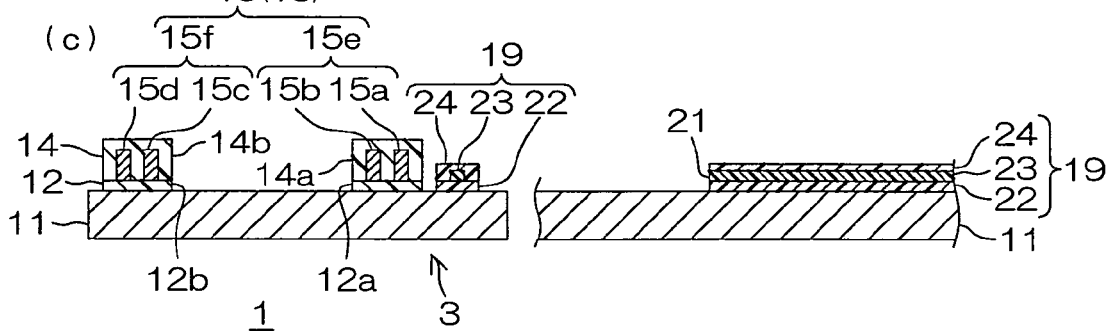
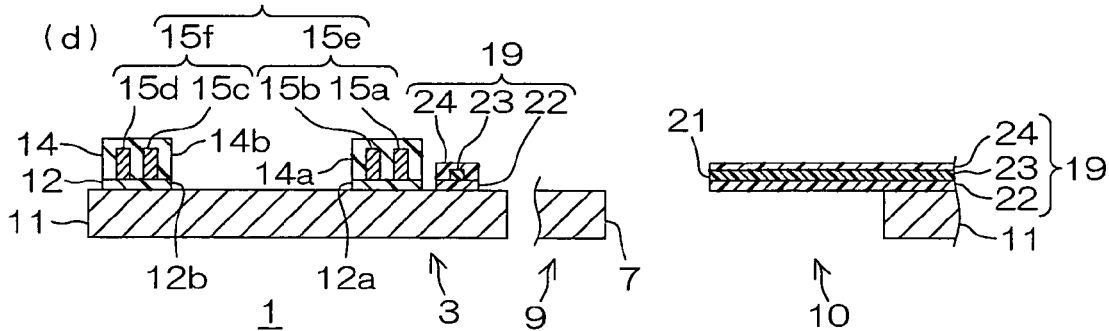
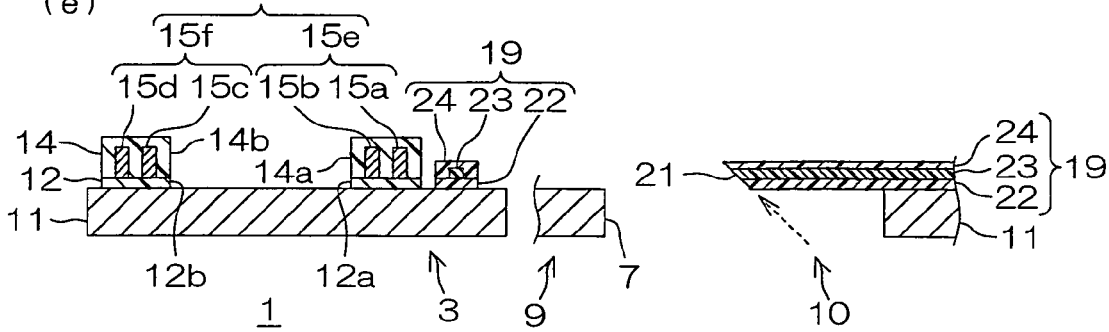

FIG. 7
(a)
(b)
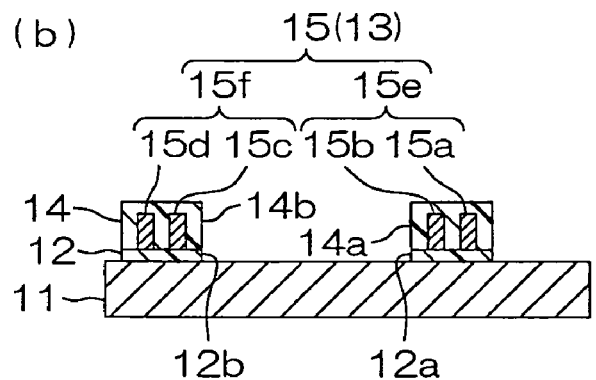
(c)
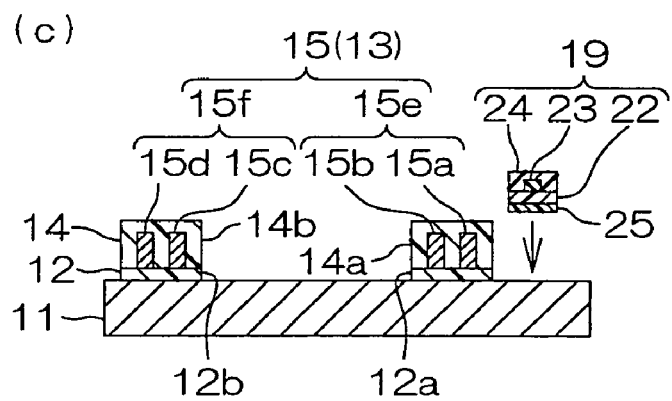
(d)
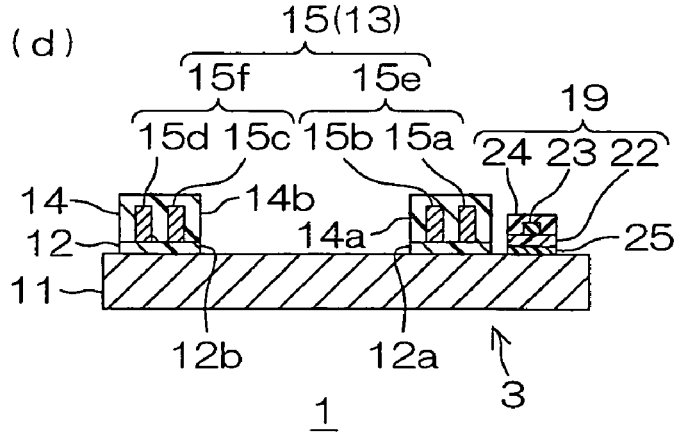

SUSPENSION BOARD WITH CIRCUIT AND PRODUCING METHOD THEREOF

CROSS-REFERENCE TO RELATED APPLICATIONS

This application claims the benefit of U.S. Provisional Application No. 61/129,726, filed Jul. 15, 2008, and claims priority from Japanese Patent Application No. 2008-177203, filed Jul. 7, 2008, the contents of which are herein incorporated by reference in their entirety.

BACKGROUND OF THE INVENTION

1. Field of the Invention

The present invention relates to a suspension board with circuit and a producing method thereof. More particularly, the present invention relates to a suspension board with circuit mounted on a hard disk drive which adopts an optical assist system, and a producing method thereof.

2. Description of Related Art

In recent years, an optical assist system (optical assist magnetic recording system) has been known as a magnetic recording system for a hard disk drive or the like that is capable of recording information at high density in a small recording magnetic field by heating a hard disk drive under light irradiation during recording of information, and then recording the information with a magnetic head in a state where the coercive force of the hard disk is reduced.

There has been proposed that, for example, in an optical assist magnetic recording apparatus adopting the optical assist system, a magnetic recording/reproducing device is provided by forming a magnetic reproducing element and a magnetic recording element (magnetic head), an optical waveguide, and a light source on a side surface of a head slider, and the head slider is supported by a suspension (cf. Japanese Unexamined Patent Publication No. 2000-195002).

SUMMARY OF THE INVENTION

However, the head slider is formed relatively small to satisfy the need for miniaturization, and is also provided with the magnetic head, so that it is difficult to install any other components on the head slider because of the limited space. Therefore, when the optical waveguide and the light source both used in the optical assist system are provided on the head slider together with the magnetic head, the layout is limited, so that the production is troublesome, resulting in an increase in production cost.

It is an object of the present invention to provide a suspension board with circuit and a producing method thereof capable of ensuring designing flexibility while allowing to adopt an optical assist system, improving production efficiency, and achieving reduction of production cost.

The suspension board with circuit of the present invention includes a metal supporting board; an insulating base layer formed on the metal supporting board; a conductive pattern formed on the insulating base layer; an insulating cover layer formed on the insulating base layer so as to cover the conductive pattern; and an optical waveguide, in which the optical waveguide is provided on the metal supporting board separately from the insulating base layer, the conductive pattern, and the insulating cover layer.

In the suspension board with circuit of the present invention, it is preferable that the upper surface of the optical waveguide is lower than the upper surface of the insulating cover layer.

In the suspension board with circuit of the present invention, it is preferable that the optical waveguide includes an under clad layer; a core layer formed on the under clad layer and having a higher refractive index than that of the under clad layer; and an over clad layer formed on the under clad layer so as to cover the core layer and having a lower refractive index than that of the core layer, and the under clad layer is directly laminated on the upper surface of the metal supporting board.

In the suspension board with circuit of the present invention, it is preferable that the optical waveguide includes an under clad layer; a core layer formed on the under clad layer and having a higher refractive index than that of the under clad layer; and an over clad layer formed on the under clad layer so as to cover the core layer and having a lower refractive index than that of the core layer, and the under clad layer is laminated on the upper surface of the metal supporting board via an adhesive layer.

It is preferable that the suspension board with circuit of the present invention further includes a light emitting device, in which the light emitting device is optically connected with the optical waveguide.

It is preferable that the suspension board with circuit of the present invention further includes a mounting portion for mounting a head slider, in which the optical waveguide is arranged along a direction in which the conductive pattern extends, the light emitting device is arranged on one side in a lengthwise direction of the metal supporting board, and the mounting portion is arranged on the other side in the lengthwise direction of the metal supporting board.

In the suspension board with circuit of the present invention, since the optical waveguide used in the optical assist system is provided on the metal supporting board separately from the insulating base layer, the conductive pattern, and the insulating cover layer, the optical waveguide can be formed with more sufficient space than the head slider. This allows to ensure designing flexibility, to improve production efficiency, and to achieve reduction of production cost.

Further, since the optical waveguide is provided on the metal supporting board separately from the insulating base layer, the conductive pattern, and the insulating cover layer, the suspension board with circuit can be made thinner. Therefore, when the suspension board with circuit is mounted on a block E, the optical waveguide can effectively prevent contact with the block E, thereby effectively preventing damage or break in the optical waveguide.

The method for producing a suspension board with circuit according to the present invention comprises the steps of preparing a metal supporting board, and forming an insulating base layer formed on the metal supporting board, forming a conductive pattern formed on the insulating base layer, and forming an insulating cover layer formed on the insulating base layer so as to cover the conductive pattern; and providing an optical waveguide on the metal supporting board separately from the insulating base layer, the conductive pattern, and the insulating cover layer.

According to the method for producing the suspension board with circuit of the present invention, the optical waveguide used in the optical assist system can be formed on the metal supporting board while having more sufficient space than the head slider. Therefore, designing flexibility can be ensured.

BRIEF DESCRIPTION OF THE DRAWINGS

FIG. 4 is a sectional view illustrating the steps of producing the suspension board with circuit shown in FIG. 3, in which the left-side figure is a sectional view of the wire portion corresponding to FIG. 3 taken along the widthwise direction, and the right-side figure is an enlarged sectional view of a terminal forming portion taken along the lengthwise direction, (a) showing the step of preparing a metal supporting board, (b) showing the step of sequentially laminating an insulating base layer, a conductive pattern, and an insulating cover layer on the metal supporting board, (c) showing the step of forming an optical waveguide on the metal supporting board, (d) showing the step of forming an opening in the metal supporting board of the terminal forming portion, and (e) showing the step of cutting the optical waveguide;

FIG. 7 is a sectional view illustrating the steps of producing the suspension board with circuit shown in FIG. 6, (a) showing the step of preparing a metal supporting board, (b) showing the step of sequentially laminating an insulating base layer, a conductive pattern, and an insulating cover layer on the metal supporting board, (c) showing the step of preparing an optical waveguide and laminating an adhesive layer on the undersurface of an under clad layer, and (d) showing the step of adhering the under clad layer to the upper surface of the metal supporting board via the adhesive layer;

DETAILED DESCRIPTION OF PREFERRED EMBODIMENTS

Figure 1:
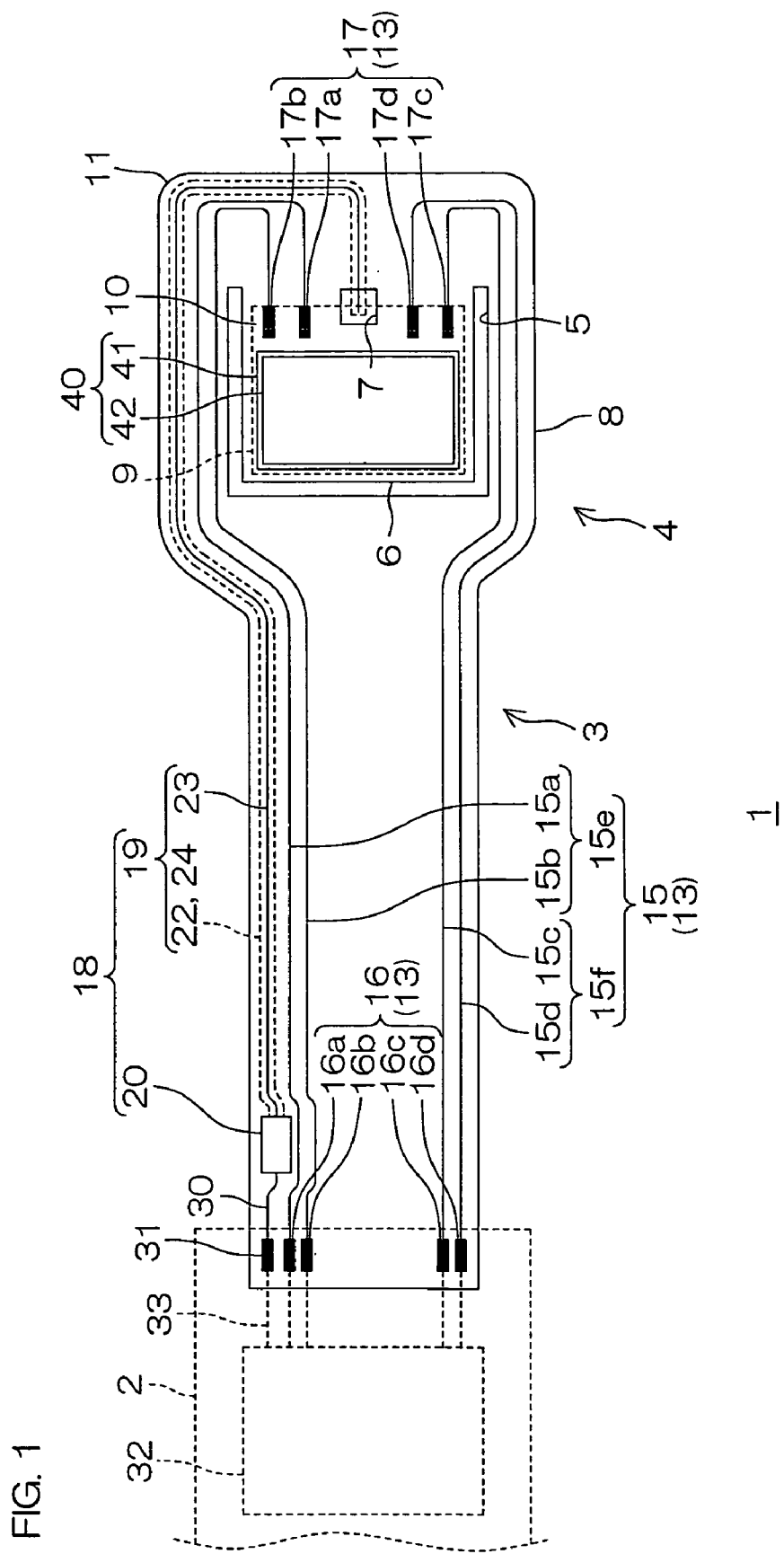
FIG. 1 is a plan view illustrating a suspension board with circuit of an embodiment according to the present invention.
Figure 2:
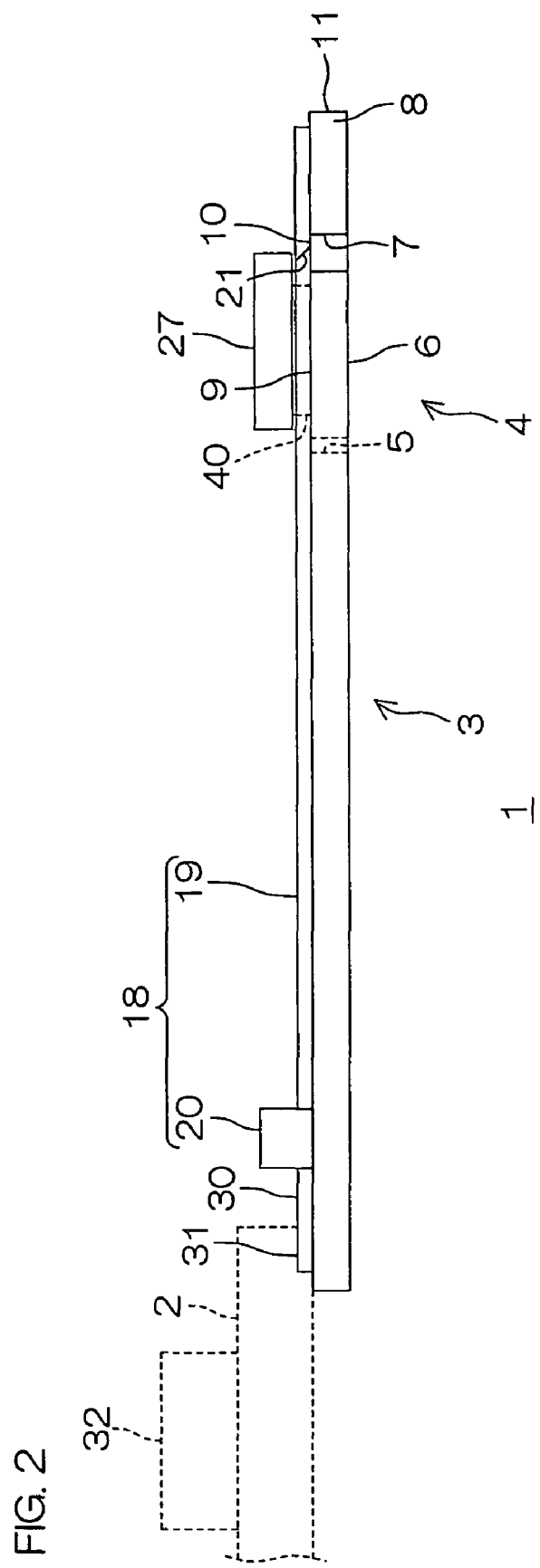
FIG. 2 is a sectional view of the suspension board with circuit shown in FIG. 1 taken along an optical waveguide.
Figure 3:
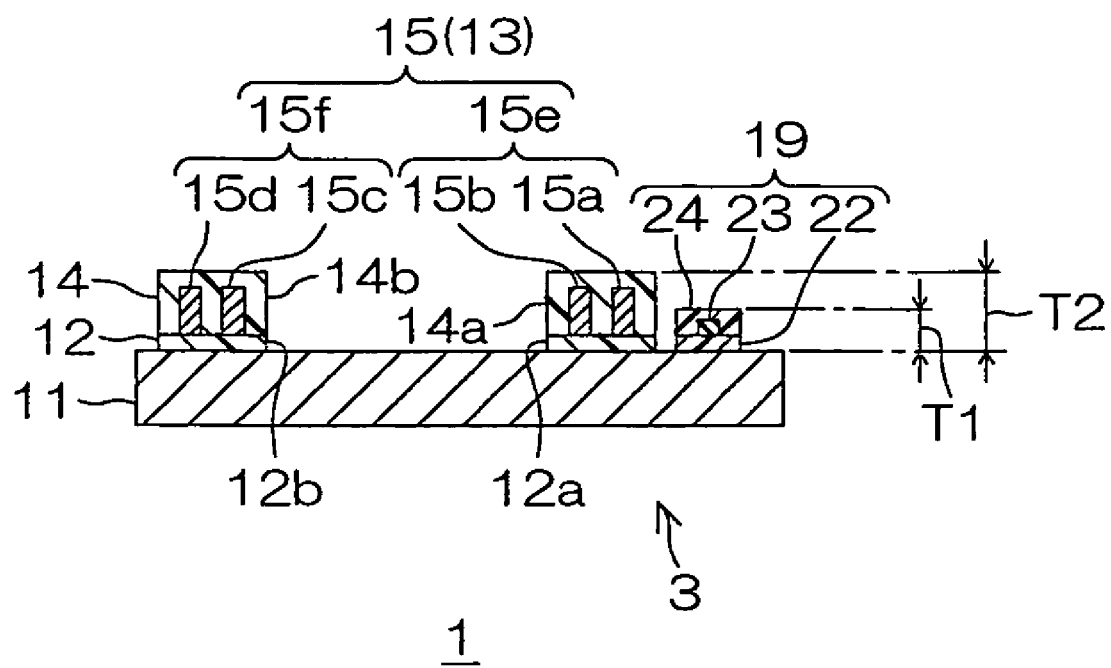
FIG. 3 is a sectional view of a wire portion of the suspension board with circuit shown in FIG. 1 taken along a widthwise direction, illustrating an embodiment in which the optical waveguide is directly laminated on the upper surface of a metal supporting board.

FIG. 1 is a plan view illustrating a suspension board with circuit of an embodiment according to the present invention, FIG. 2 is a sectional view of the suspension board with circuit shown in FIG. 1 taken along an optical waveguide, and FIG. 3 is a sectional view of a wire portion of the suspension board with circuit shown in FIG. 1 taken along a direction perpendicular to the lengthwise direction (hereinafter referred to as the widthwise direction), illustrating an embodiment in which the optical waveguide is directly laminated on the upper surface of a metal supporting board. To clarify a relative position of a conductive pattern 13 and an optical waveguide 19, an insulating base layer 12 and an insulating cover layer 14 are omitted in FIGS. 1 and 2.

In FIG. 1, the suspension board with circuit 1 includes a metal supporting board 11 mounted on a hard disk drive. A conductive pattern 13 for connecting an external circuit board (e.g., a read/write board, etc.) 2 and a magnetic head (not shown) is integrally formed on the metal supporting board 11. The metal supporting board 11 supports the magnetic head mounted thereon, while holding a minute gap between the magnetic head and a hard disk 26 (cf. FIG. 5) against an airflow caused when the magnetic head and the hard disk 26 travel relatively to each other.

The suspension board with circuit 1 is formed in the shape of a flat belt extending in the lengthwise direction, and integrally includes a wire portion 3 arranged on one side in the lengthwise direction (hereinafter referred to as the rear side), and a gimbal portion 4 arranged on the other side in the lengthwise direction (hereinafter referred to as the front side) of the wire portion 3.

The wire portion 3 is formed in a generally rectangular shape in plane view extending in the lengthwise direction.

The gimbal portion 4 is continuously formed from the front end of the wire portion 3, while having a generally rectangular shape in plane view expanding toward both widthwise outer sides with respect to the wire portion 3. The gimbal portion 4 is also formed with a slit portion 5 having a generally U-shape opening toward the front side in plane view. Further, the gimbal portion 4 integrally includes a tongue portion 6 sandwiched by the slit portion 5 in the widthwise direction, and an outrigger portion 8 arranged on both the widthwise outer sides of the slit portion 5 and on the front end side of the tongue portion 6.

The tongue portion 6 is formed in a generally rectangular shape in plane view, and includes a mounting portion 9.

The mounting portion 9 is a region (within dashed lines in FIG. 1) for mounting a head slider 27 (cf. FIG. 5), arranged along substantially the entire tongue portion 6 in plane view, and formed in a generally rectangular shape in plane view. The mounting portion 9 also includes a terminal forming portion 10 and a pedestal 40.

The terminal forming portion 10 is a region in which a magnetic-head-side connecting terminal portion 17 described later is formed, having a generally rectangular shape in plane view extending along the widthwise direction, and is arranged on the front end side with respect to the mounting portion 9. Further, the terminal forming portion 10 has an opening 7 formed therein.

The opening 7 has a generally rectangular shape in plane view penetrating the metal supporting board 11 in the thickness direction, and is formed at the widthwise center of the terminal forming portion 10. The opening 7 is also formed across the front end portion of the terminal forming portion 10 and the rear end portion of the widthwise center of the outrigger portion 8 so as to straddle the front end edge (the rear end edge of the terminal forming portion 10) of the mounting portion 9 in plane view.

The pedestal 40 is provided in order to support the head slider 27 (cf. FIG. 5) and is arranged on the rear side of the terminal forming portion 10, specifically, arranged in the middle of (partway) the mounting portion 9 in the lengthwise direction and the rear end portion thereof. The pedestal 40 is formed in a generally rectangular shape in plane view extending in the widthwise direction.

The pedestal 40 includes a pedestal insulating base layer 41 and a pedestal conductive layer 42 formed on the pedestal insulating base layer 41.

The pedestal insulating base layer 41 is formed on a surface of the metal supporting board 11 in the mounting portion 9, corresponding to the outer shape of the pedestal 40.

The pedestal conductive layer 42 is formed on a surface of the pedestal insulating base layer 41 in a similar shape slightly smaller than the pedestal insulating base layer 41 in plane view.

The conductive pattern 13 includes an external connecting terminal portion 16, a magnetic-head-side connecting terminal portion 17, and a signal wire 15 for connecting the external connecting terminal portion 16 and the magnetic-head-side connecting terminal portion 17, which are formed integrally and continuously.

A plurality (four pieces) of signal wires 15 are provided along the lengthwise direction of the suspension board with circuit 1, each signal wire 15 arranged in parallel at spaced intervals to each other in the widthwise direction.

The plurality of signal wires 15 are formed with a first wire 15a, a second wire 15b, a third wire 15c, and a fourth wire 15d, and the first wire 15a, the second wire 15b, the third wire 15c, and the fourth wire 15d are sequentially arranged from one side in the widthwise direction toward the other side in the widthwise direction.

More specifically, the first wire 15a, the second wire 15b, the third wire 15c, and the fourth wire 15d are formed so as to extend in parallel to each other in the wire portion 3. In the gimbal portion 4, the first wire 15a and the second wire 15b (a first pair of wires 15e) are arranged along the outrigger portion 8 on one side in the widthwise direction, while the third wire 15c and the fourth wire 15d (a second pair of wires 15f) are arranged along the outrigger portion 8 on the other side in the widthwise direction. The first wire 15a, the second wire 15b, the third wire 15c, and the fourth wire 15d (the first pair of wires 15e and the second pair of wires 15f) are arranged to reach the front end side of the outrigger portion 8, then extend inward in the widthwise direction, yet turn back toward the rear side, and finally to reach the front end portion of the magnetic-head-side connecting terminal portion 17.

In the wire portion 3, the first pair of wires 15e and the second pair of wires 15f are spaced apart from each other and each arranged on both end portions of the wire portion 3 in the widthwise direction.

The first wire 15a and the second wire 15b (the first pair of wires 15e) are arranged at spaced intervals to a light emitting device 20 described later on the widthwise inner side in the wire portion 3 so as to make a detour around the light emitting device 20 toward the widthwise inner side.

A plurality (four pieces) of external connecting terminal portions 16 are provided in the rear end portion of the wire portion 3, and arranged to be each connected with the rear end portion of each of the wires 15. Further, the external connecting terminal portions 16 are arranged at spaced intervals to each other in the widthwise direction. In the external connecting terminal portions 16, a first external connecting terminal portion 16a, a second external connecting terminal portion 16b, a third external connecting terminal portion 16c, and a fourth external connecting terminal portion 16d are sequentially arranged from one side in the widthwise direction toward the other side in the widthwise direction, corresponding to the first wire 15a, the second wire 15b, the third wire 15c, and the fourth wire 15d, respectively, which are connected to each of the external connecting terminal portions 16. A terminal portion, which is not shown, of the external circuit board 2 indicated by dashed lines is connected to each of the external connecting terminal portions 16.

The magnetic-head-side connecting terminal portion 17 is arranged in the gimbal portion 4, and more specifically, arranged in the terminal forming portion 10 of the tongue portion 6. A plurality (four pieces) of magnetic-head-side connecting terminal portions 17 are provided with each connected with the front end portion of each of the signal wires 15.

More specifically, the magnetic-head-side connecting terminal portions 17 are arranged along the rear end edge (the front end edge of the mounting portion 9) of the terminal forming portion 10 at spaced intervals to each other in the widthwise direction. The magnetic-head-side connecting terminal portions 17 is formed from a first magnetic-head-side connecting terminal portion 17a, a second magnetic-head-side connecting terminal portion 17b, a third magnetic-head-side connecting terminal portion 17c, and a fourth magnetic-head-side connecting terminal portion 17d, corresponding to the first wire 15a, the second wire 15b, the third wire 15c, and the fourth wire 15d, respectively, which are connected to the magnetic-head-side connecting terminal portion 17. The second magnetic-head-side connecting terminal portion 17b, the first magnetic-head-side connecting terminal portion 17a, the fourth magnetic-head-side connecting terminal portion 17d, and the third magnetic-head-side connecting terminal portion 17c are sequentially arranged from one side in the widthwise direction toward the other side in the widthwise direction. A terminal portion of the magnetic head, which is not shown, is connected to each of the magnetic-head-side connecting terminal portions 17.

As shown in FIG. 3, the suspension board with circuit 1 includes the metal supporting board 11, the insulating base layer 12 formed on the metal supporting board 11, the conductive pattern 13 formed on the insulating base layer 12, and the insulating cover layer 14 formed on the insulating base layer 12 so as to cover the conductive pattern 13.

As shown in FIGS. 1 and 3, the metal supporting board 11 is formed corresponding to the outer shape of the suspension board with circuit 1.

The insulating base layer 12 is formed on the upper surface of the metal supporting board 11 so as to expose the peripheral end edge of the metal supporting board 11 and so as to correspond to a position where the conductive pattern 13 in the wire portion 3 and the gimbal portion 4 is formed.

More specifically, the insulating base layer 12 is formed in the shape of a flat belt slightly shorter in the lengthwise direction than the metal supporting board 11. The insulating base layer 12 is also formed from two insulating base layers opposed at a spaced interval to each other in the width direction.

More particularly, the insulating base layer 12 has a first insulating base layer 12a provided corresponding to a position where the first pair of wires 15e are formed and a second insulating base layer 12b provided corresponding to a position where the second pair of wires 15f are formed. The first insulating base layer 12a is formed in widthwise one end portion of the wire portion 3 and the outrigger portion 8 while the second insulating base layer 12b is arranged at a spaced interval to the first insulating base layer 12a on the other side in the widthwise direction and is formed in the widthwise other end portion of the wire portion 3.

Further, the insulating base layer 12 (the first insulating base layer 12a) is arranged on the metal supporting board 11 so as to reserve a region for forming an optical waveguide 19 described later.

The insulating base layer 12 is formed so as to correspond to a position where a supply wire 30 and a supply terminal portion 31, which are described later, are formed.

The conductive pattern 13 is arranged over the wire portion 3 and the gimbal portion 4 so as to be contained in the insulating base layer 12 when projected in the thickness direction. That is, the first pair of wires 15e are contained in the first insulating base layer 12a, while the second pair of wires 15f are contained in the second insulating base layer 12b. The conductive pattern 13 is formed on the upper surface of the insulating base layer 12 as a wired circuit pattern including the external connecting terminal portion 16 and the magnetic-head-side connecting terminal portion 17, and the signal wire 15, which are formed integrally and continuously.

The insulating cover layer 14 is arranged over the wire portion 3 and the gimbal portion 4, and is located on the upper surface of the insulating base layer 12 so as to correspond to a position where the signal wire 15 is formed. Further, the insulating cover layer 14 is formed so as to expose the external connecting terminal portion 16 and the magnetic-head-side connecting terminal portion 17, and so as to cover the signal wire 15. The insulating cover layer 14 has two insulating cover layers corresponding to the first pair of wires 15e and the second pair of wires 15f.

Specifically, the insulating cover layer 14 has a first insulating cover layer 14a formed on the first insulating base layer 12a so as to cover the first pair of wires 15e and a second insulating cover layer 14b formed on the second insulating base layer 12b so as to cover the second pair of wires 15f. Further, the insulating cover layer 14 (the first insulating cover layer 14a and the second insulating cover layer 14b) is formed (respectively) so that its peripheral end edge is in generally the same position in plane view as the peripheral end edge of the insulating base layer 12 (the first insulating base layer 12a and second insulating base layer 12b).

More particularly, widthwise one side surface of the insulating cover layer 14 (the first insulating cover layer 14a) in the wire portion 3 and in the outrigger portion 8 on one side in the widthwise direction (except the front end portion) is formed at a spaced interval in plane view to the first wire 15a on one side in the widthwise direction, that is, on the side opposite to the second wire 15b with respect to the first wire 15a. Further, the front end surface of the insulating cover layer 14 (the first insulating cover layer 14a or the second insulating cover layer 14b) in the outrigger portion 8 in the front end portion is formed at a spaced interval in plane view to the first wire 15a on the side opposite to the second wire 15b with respect to the first wire 15a (on the rear side, or to the fourth wire 15d on the side opposite to the third wire 15c with respect to the fourth wire 15d). Furthermore, the widthwise other side surface (inner side surface) of the insulating cover layer 14 (the first insulating cover layer 14a) in the outrigger portion 8 partway along the widthwise direction (a portion between widthwise one end portion and the widthwise center, except the front end portion) is formed at a spaced interval in plane view to the first wire 15a on the (inner) side opposite to the second wire 15b with respect to the first wire 15a.

That is, one side surface (one side surface of the first insulating cover layer 14a opposed to the first wire 15a in the width direction) of the insulating cover layer 14 (the first insulating cover layer 14a) is opposed at a spaced interval to the first wire 15a.

Further, the widthwise other side surface of the insulating cover layer 14 (the second insulating cover layer 14b) in the wire portion 3 and in the outrigger portion 8 on the other side in the widthwise direction (except the front end portion) is formed at a spaced interval in plane view with respect to the fourth wire 15d on the other side in the widthwise direction, that is, on the side opposite to the third wire 15c with respect to the fourth wire 15d. Furthermore, widthwise one side surface (inner side surface) of the insulating cover layer 14 (the second insulating cover layer 14b) in the outrigger portion 8 partway along the widthwise direction (a portion between the widthwise other end portion and the widthwise center, except the front end portion) is formed at a spaced interval in plane view to the fourth wire 15d on the (inner) side opposite to the third wire 15c with respect to the fourth wire 15d.

That is, the other side surface (the other side surface of the second insulating cover layer 14b opposed to the fourth wire 15d in the width direction) of the insulating cover layer 14 (the second insulating cover layer 14b) is opposed at a spaced interval to the fourth wire 15d.

The suspension board with circuit 1 includes an optical assist portion 18 used in the optical assist system as shown in FIG. 1.

The optical assist portion 18 is independently provided on the metal supporting board 11, separately from the insulating base layer 12, the conductive pattern 13, and the insulating cover layer 14, which are described above. The optical assist portion 18 includes an optical waveguide (a first waveguide) 19 and a light emitting device 20.

As shown in FIGS. 1 and 3, the optical waveguide 19 is arranged over the wire portion 3 and the gimbal portion 4, and independently provided on the upper surface of the metal supporting board 11, separately from the insulating base layer 12, the conductive pattern 13, and the insulating cover layer 14. That is, the optical waveguide 19 extends along a direction in which the conductive pattern 13 extends and is spaced apart from the insulating base layer 12 and the insulating cover layer 14.

The optical waveguide 19 is also formed so as to extend in parallel to the first wire 15a. More particularly, the optical waveguide 19 is arranged at a spaced interval on one side of the first insulating base layer 12a and the first insulating cover layer 14a, that is, on the side opposite to the second insulating base layer 12b and the second insulating cover layer 14b with respect to the first insulating base layer 12a and the first insulating cover layer 14a.

More specifically, the optical waveguide 19 in the wire portion 3 and in the outrigger portion 8 on one side in the widthwise direction is arranged on one side in the widthwise direction at a spaced interval to widthwise one side surfaces (widthwise one side surfaces of the first insulating base layer 12a and the first insulating cover layer 14a opposed to one side of the first wire 15a in the widthwise direction) of the insulating base layer 12 (the first insulating base layer 12a) and the insulating cover layer 14 (the first insulating cover layer 14a). The optical waveguide 19 in the outrigger portion 8 in the front end portion is also arranged on the front side at a spaced interval to the front end surfaces of the insulating base layer 12 (the first insulating base layer 12a) and the insulating cover layer 14 (the first insulating cover layer 14a).

The optical waveguide 19 in the outrigger portion 8 partway along the widthwise direction is further arranged on the other (inner) side in the widthwise direction at a spaced interval to the widthwise other side surfaces (inner side surface) of the insulating base layer 12 (the first insulating base layer 12a) and the insulating cover layer 14 (the first insulating cover layer 14a).

Specifically, the optical waveguide 19 is arranged to extend in parallel to the first wire 15a (and one side surfaces of the first insulating base layer 12a and the first insulating cover layer 14a), then turn back toward the rear side on the front end side of the outrigger portion 8, thereafter, extend along the widthwise center of the gimbal portion 4, and finally reach the opening 7.

Moreover, the optical waveguide 19 is optically connected to the light emitting device 20 and a second optical waveguide 34 (cf. FIG. 5) described later. More specifically, the rear end of the optical waveguide 19 is connected to the light emitting device 20 while the front end thereof faces the opening 7 and is optically connected to the second optical waveguide 34 of the head slider 27 when the head slider 27 is mounted.

The light emitting device 20 is a light source for allowing light to enter the optical waveguide 19, and for example, converts electric energy into light energy to emit high-energy light. The light emitting device 20 is arranged on the rear end side of the metal supporting board 11, and more specifically, arranged on the rear end side of the wire portion 3 at a spaced interval to the external connecting terminal portion 16 on the front side thereof, and spaced apart from the signal wire 15 (the first wire 15a) on one side in the widthwise direction. The light emitting device 20 is formed on the metal supporting board 11.

A supply wire 30 for supplying electric energy to the light emitting device 20 is connected to the light emitting device 20, and a supply terminal portion 31 to be connected to a terminal portion, which is not shown, of the external circuit board 2 is connected to the supply wire 30. The supply wire 30 extends along the signal wire 15 (the first wire 15a) on the rear end side of the light emitting device 20, and the supply terminal portion 31 is arranged at a spaced interval to the external connecting terminal portion 16 (the first external connecting terminal portion 16a) on one side in the widthwise direction. Both the supply wire 30 and the supply terminal portion 31 are formed on the insulating base layer 12, and the supply wire 30 is covered with the insulating cover layer 14, and the supply terminal portion 31 is exposed from the insulating cover layer 14.

In the optical assist portion 18, the electric energy supplied through the supply terminal portion 31 and the supply wire 30 from the external circuit board 2 is converted into light energy in the light emitting device 20, and the resulting light is emitted to the optical waveguide 19. The light thus emitted passes the optical waveguide 19 and is reflected on an end face 21 described below, and the reflected light is entered into the second optical waveguide 34 (cf. FIG. 5) of the head slider 27.

Figure 5:
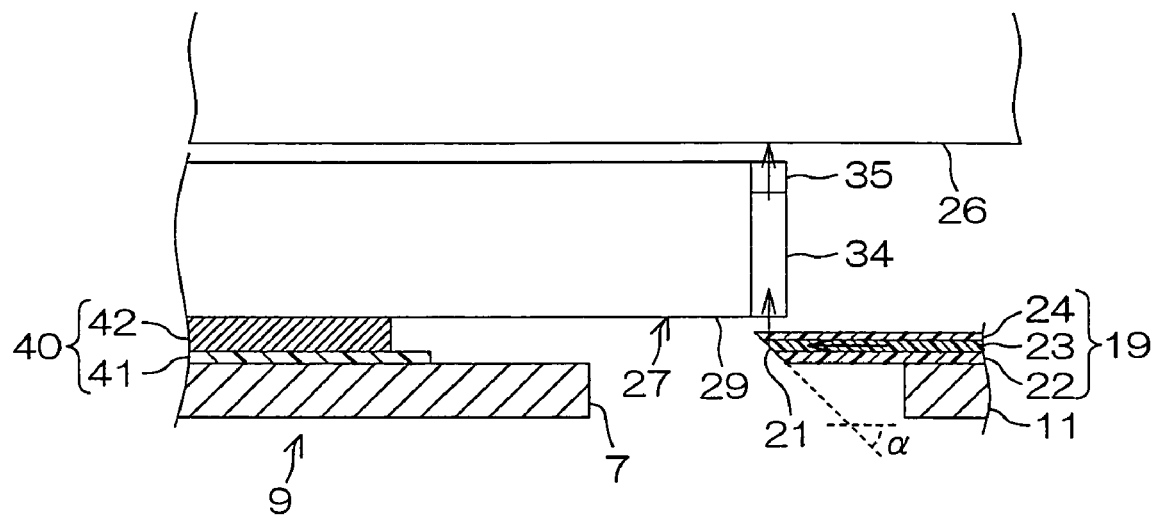
FIG. 5 is an explanatory view of a state in which a hard disk drive mounting a head slider, a magnetic head, and the suspension board with circuit shown in FIG. 1 thereon adopts an optical assist system to record information on a hard disk.

As shown in FIG. 5, the optical waveguide 19 is formed so that the end face 21 of the front end portion thereof intersects the lengthwise direction of the optical waveguide 19 at a given angle (tilt angle) α, for example. This forms the optical waveguide 19 so that the end face 21 thereof is a mirror surface having the tilt angle α. The light entered the optical waveguide 19 has its optical path deflected by the end face 21 at a given angle, and the light thus deflected is applied toward an entrance (described later) of the second optical waveguide 34. Such tilt angle α is not particularly limited, and is in the range of, for example, 35 to 55°, or preferably 40 to 50°, or more specifically 45°.

As shown in FIG. 3, in the suspension board with circuit 1, the optical waveguide 19 is directly provided on the upper surface of the metal supporting board 11.

Such optical waveguide 19 includes an under clad layer 22, a core layer 23 formed on the under clad layer 22, and an over clad layer 24 formed on the under clad layer 22 so as to cover the core layer 23.

As shown in FIGS. 1 and 5, in the optical waveguide 19, a portion (including the end face 21) facing the opening 7 is exposed from the opening 7 in the metal supporting board 11.

As shown in FIG. 3, the under clad layer 22 is directly laminated on the upper surface of the metal supporting board 11.

The over clad layer 24 is formed so that both widthwise outer end edges thereof are in the same positions in plane view as those of the under clad layer 22.

FIG. 4 is a sectional view illustrating the steps of producing the suspension board with circuit shown in FIG. 3, in which the left-side figure is a sectional view of the wire portion corresponding to FIG. 3 taken along the widthwise direction, and the right-side figure is an enlarged sectional view of a terminal forming portion taken along the lengthwise direction.

Next, a method for producing the suspension board with circuit 1 is described with reference to FIG. 4.

In this method, a metal supporting board 11 is first prepared, as shown in FIG. 4(a).

The metal supporting board 11 is formed of a metal material, such as stainless steel, 42-alloy, aluminum, copper-beryllium, or phosphor bronze. The metal supporting board 11 has a thickness in the range of, for example, 15 to 30 μm, or preferably 20 to 25 μm.

Subsequently, in this method, as shown in FIG. 4(b), an insulating base layer 12, a conductive pattern 13, and an insulating cover layer 14 are sequentially laminated on the metal supporting board 11.

To sequentially laminate these layers, the insulating base layer 12 is first formed on the upper surface of the metal supporting board 11. The insulating base layer 12 is formed simultaneously with a pedestal insulating base layer 41 (cf. FIG. 1).

The insulating base layer 12 and the pedestal insulating base layer 41 are formed of an insulating material such as synthetic resin, for example, polyimide resin, polyamide imide resin, acrylic resin, polyether nitrile resin, polyether sulfone resin, polyethylene terephthalate resin, polyethylene naphthalate resin, polyvinyl chloride resin, or the like. They are preferably formed of polyimide resin.

To form the insulating base layer 12 and the pedestal insulating base layer 41, for example, a varnish of the insulating material described above having photosensitivity is applied to the upper surface of the metal supporting board 11 and is then dried. Thereafter, the dried varnish is exposed to light via a photomask, and is then developed to be cured as required.

The insulating base layer 12 and the pedestal insulating base layer 41 thus formed each have a thickness in the range of, for example, 2 to 40 μm, or preferably 3 to 20 μm.

Subsequently, the conductive pattern 13 is formed in the above-mentioned pattern. The conductive pattern 13 is formed simultaneously with a pedestal conductive layer 42 (cf. FIG. 1).

As a conductive material for forming the conductive pattern 13 and the pedestal conductive layer 42, for example, copper, nickel, gold, solder, or alloys thereof is used.

The conductive pattern 13 and the pedestal conductive layer 42 are formed using a known patterning method, such as an additive method or a subtractive method. Preferably, an additive method is used.

The conductive pattern 13 and the pedestal conductive layer 42 thus formed each have a thickness in the range of, for example, 2 to 35 µm, or preferably 3 to 20 µm. Each of signal wires 15 has a width in the range of, for example, 10 to 200 µm, or preferably 20 to 100 µm, and a spacing between each of the signal wires 15 is in the range of, for example, 10 to 1000 µm, or preferably 20 to 100 µm. Each of external connecting terminal portions 16 and each of magnetic-head-side connecting terminal portions 17 have a width in the range of, for example, 20 to 1000 µm, or preferably 30 to 800 µm, and a spacing between each of the external connecting terminal portions 16 and a spacing between each of the magnetic-head-side connecting terminal portions 17 are in the range of, for example, 20 to 1000 µm, or preferably 30 to 800 µm.

To form the insulating cover layer 14 in the above-mentioned pattern, for example, a varnish of the insulating material described above having photosensitivity is applied to the upper surface of the metal supporting board 11 including the conductive pattern 13 and the insulating base layer 12, and is then dried. Thereafter, the dried varnish is exposed to light via a photomask, and is then developed to be cured as required.

The insulating cover layer 14 thus formed has a thickness in the range of, for example, 2 to 30 µm, or preferably 3 to 20 µm.

Therefore, the insulating base layer 12, the conductive pattern 13, and the insulating cover layer 14 can be sequentially laminated on the metal supporting board 11.

A thickness T2 of the insulating base layer 12, the conductive pattern 13, and the insulating cover layer 14, that is, a thickness T2 from the upper surface of the metal supporting board 11 to the insulating cover layer 14 is in the range of, for example, 7 to 100 µm, or preferably 10 to 50 µm.

At the same time, a pedestal 40 including the pedestal insulating base layer 41 and the pedestal conductive layer 42 can be formed. Simultaneously with the formation of the above-mentioned conductive pattern 13, a supply wire 30 and a supply terminal portion 31 are simultaneously formed in the same manner as above.

Subsequently, in this method, as shown in FIG. 4(c), an optical waveguide 19 is provided on the metal supporting board 11 separately from the insulating base layer 12, the conductive pattern 13, and the insulating cover layer 14.

That is, in this method, an optical waveguide 19 is independently formed directly on the upper surface of the metal supporting board 11 exposed from the insulating base layer 12 and the insulating cover layer 14, separately from the insulating base layer 12, the conductive pattern 13, and the insulating cover layer 14.

Specifically, the optical waveguide 19 is formed by sequentially laminating an under clad layer 22, a core layer 23, and a over clad layer 24 on the metal supporting board 11.

To sequentially laminate these layers, the under clad layer 22 is first formed on the upper surface of the metal supporting board 11.

As a material for forming the under clad layer 22, for example, polyimide resin, polyamide resin, silicone resin, epoxy resin (alicyclic epoxy resin, etc.), acrylic resin, fluorene derivative resin, a mixed resin of fluorene derivative resin and alicyclic epoxy resin, or a mixed resin of any of these resins and an alicyclic ether compound (e.g., an oxetane compound, etc.) is used. These resins are preferably used in the form of photosensitive resins containing a photosensitizer. Preferably, a mixed resin of a photosensitive fluorene derivative resin (a photosensitive fluorene epoxy resin as raw material) and an alicyclic epoxy resin is used. The photosensitizer that may be used includes, for example, a known onium salt, and more specifically, 4,4-bis[di(β-hydroxyethoxy)phenylsulfinio] phenylsulfide-bis-hexafluoroantimonate, or the like.

To form the under clad layer 22 in the above-mentioned pattern, for example, a varnish (resin solution) of any of the above-mentioned resins is prepared using a known diluent, the varnish thus prepared is applied to the upper surface of the metal supporting board 11. Thereafter, the applied varnish is dried, and is then cured as required. In the case of using a varnish of a photosensitive resin, after application and drying of the varnish, the dried varnish is exposed to light via a photomask, and is then developed by dissolving an unexposed portion with a known organic solvent or the like. Thereafter, the developed varnish is cured as required.

The under clad layer 22 thus formed has a refractive index in the range of, for example, 1.45 to 1.55. Further, the under clad layer 22 has a thickness in the range of, for example, 1 to 35 µm, or preferably 2 to 15 µm, and has a width in the range of, for example, 20 to 200 µm, or preferably 30 to 100 µm.

Subsequently, the core layer 23 is formed on the upper surface of the under clad layer 22.

As a material for forming the core layer 23, a resin material having a higher refractive index than that of the under clad layer 22 is used. The resin material that may be used includes, for example, the same resin as those mentioned above. Preferably, a mixed resin of a photosensitive fluorene derivative resin (a photosensitive fluorene epoxy resin as raw material) and an oxetane compound is used.

To form the core layer 23 in the above-mentioned pattern, for example, a varnish (resin solution) of any of the above-mentioned resins is prepared using a known diluent, the varnish thus prepared is applied to the upper surface of the metal supporting board 11 including the under clad layer 22. Thereafter, the applied varnish is dried, and is then cured as required. In the case of using a varnish of a photosensitive resin, after application and drying of the varnish, the dried varnish is exposed to light via a photomask, and is then developed by dissolving an unexposed portion with a known organic solvent or the like. Thereafter, the developed varnish is cured as required.

The refractive index of the core layer 23 thus formed is set higher than that of the under clad layer 22, and is in the range of, for example, 1.55 to 1.65. Further, the core layer 23 has a thickness in the range of, for example, 1 to 20 µm, or preferably 2 to 15 µm, and has a width in the range of, for example, 1 to 30 µm, or preferably 2 to 20 µm.

Subsequently, the over clad layer 24 is formed on the upper surface of the under clad layer 22 so as to cover the core layer 23.

As a material for forming the over clad layer 24, the same resin material as that for the under clad layer 22 described above is used.

To form the over clad layer 24 in the above-mentioned pattern, for example, a varnish (resin solution) of any of the above-mentioned resins is prepared using a known diluent, the varnish thus prepared is applied to the upper surface of the metal supporting board 11 including the core layer 23 and the under clad layer 22. Thereafter, the applied varnish is dried, and is then cured as required. In the case of using a varnish of a photosensitive resin, after application and drying of the varnish, the dried varnish is exposed to light via a photomask, and is then developed by dissolving an unexposed portion with a known organic solvent or the like. Thereafter, the developed varnish is cured as required.

The refractive index of the over clad layer 24 thus formed is set lower than that of the core layer 23, and is set to, for example, the same refractive index as that of the under clad layer 22. Further, the over clad layer 24 has a thickness from the upper surface of the core layer 23 in the range of, for example, 1 to 25 μm, or preferably 2 to 15 μm, and has a width in the range of, for example, 20 to 200 μm, or preferably 30 to 100 μm.

Thus, the under clad layer 22, the core layer 23, and the over clad layer 24 are sequentially laminated on the metal supporting board 11, whereby the optical waveguide 19 including these layers can be provided separately from the insulating base layer 12, the conductive pattern 13, and the insulating cover layer 14.

A thickness T1 of the optical waveguide 19 is thinner than, for example, the total thickness (specifically, thickness from the upper surface of the metal supporting board 11 to the upper surface of the insulating cover layer 14) of the insulating base layer 12, the conductive pattern 13, and the insulating cover layer 14, which are mentioned above.

That is, the upper surface of the optical waveguide 19 is lower than the upper surface of the insulating cover layer 14.

More particularly, the thickness T1 from the upper surface of the metal supporting board 11 to the upper surface of the optical waveguide 19 (the over clad layer 24) is thinner than the thickness T2 from the upper surface of the metal supporting board 11 to the upper surface of the insulating cover layer 14.

Specifically, the thickness T1 of the optical waveguide 19 is in the range of, for example, 3 to 80 μm, or preferably 6 to 40 μm.

A thickness (the total thickness of the metal supporting board 11 and the optical waveguide 19) of a region for forming the optical waveguide 19 in the suspension board with circuit 1 is, for example, 80 μm or less, or preferably 50 μm or less, and usually 18 μm or more.

Subsequently, in this method, as shown in FIG. 4(*d*), an opening 7 is formed in the metal supporting board 11 in a terminal forming portion 10.

The opening 7 is formed by, for example, boring such as drilling, or for example, etching such as dry etching and wet etching, or preferably by etching.

The opening 7 is formed so as to be overlapped with the front end portion of the optical waveguide 19 in the thickness direction, more specifically, so that the front end portion of the optical waveguide 19 is arranged in the center of the opening 7 in the widthwise direction and in a front-side half of the opening 7 in the lengthwise direction.

The opening 7 thus formed has a width in the range of, for example, 50 to 500 μm, or preferably 100 to 200 μm, and a length (a length in lengthwise direction) in the range of, for example, 50 to 500 μm, or preferably 100 to 200 μm.

Subsequently, in this method, as shown in FIG. 4(*e*), the front end portion of the optical waveguide 19 is cut from the opening 7 side by laser machining so that an end face 21 of the front end portion of the optical waveguide 19 intersects the lengthwise direction.

In the laser machining, as indicated by dashed lines in FIG. 4(*e*), a laser light which passes through the opening 7 is applied from the opening 7 side (the underside in thickness direction) to the optical waveguide 19 so as to intersect the lengthwise direction at a given angle, thereby cutting the optical waveguide 19 at a time.

Thus, the optical waveguide 19 can be cut from the opening 7 side by laser machining while the end face 21 of the front end portion of the optical waveguide 19 intersects the lengthwise direction.

Thereafter, on the rear end side of the wire portion 3, a light emitting device 20 is disposed on the upper surface of the metal supporting board 11 directly or via a known adhesive layer so as to be optically connected with the rear end of the optical waveguide 19 and then be electrically connected with the front end of the supply wire 30. Thus, the suspension board with circuit 1 is obtained.

In the suspension board with circuit 1 thus obtained, as indicated by dashed lines in FIGS. 1 and 2, the external connecting terminal portion 16 and the supply terminal portion 31 are connected in the wire portion 3 with a terminal portion, which is not shown, of the external circuit board 2. On the external circuit board 2, a magnetic head and an IC 32 for controlling the light emitting device 20 are mounted, the IC 32 being electrically connected via an IC wire 33 with terminal portions to be connected to the external connecting terminal portions 16 and the supply terminal portion 31.

In the suspension board with circuit 1, as shown in FIGS. 1 and 5, a head slider 27 is mounted on a mounting portion 9 of a gimbal portion 4. Specifically, the head slider 27 is placed on the upper surface of the pedestal 40 (the pedestal conductive layer 42).

The head slider 27 integrally includes a slider body 29, and a second optical waveguide 34 and a near-field light generation member 35 both provided in the front end portion of the slider body 29.

The second optical waveguide 34 is provided in order to allow light emitted from the end face 21 of the optical waveguide 19 to enter into the near-field light generation member 35. The second optical waveguide 34 is formed along the thickness direction (the direction where the end face 21 of the optical waveguide 19 on the suspension board with circuit 1 is opposed to a hard disk 26) of the suspension board with circuit 1, with its lower end (entrance) opposed at a spaced interval to the end face 21 of the optical waveguide 19 in the thickness direction and its upper end (exit) connected with the near-field light generation member 35 explained below.

The near-field light generation member 35 is provided in order to allow near-field light to generate from the light (propagating light) emitted from the upper end of the second optical waveguide 34, and then apply the near-field light onto the surface of the hard disk 26 to thereby heat a minute region on the surface thereof. The near-field light generation member 35 is opposed across a minute gap to the surface of the hard disk 26 in the thickness direction. Such near-field light generation member 35 includes a metal scatterer, an opening, or the like, and a known near-field light generator described in, for example, Japanese Unexamined Patent Publication No. 2007-280572, Japanese Unexamined Patent Publication No. 2007-052918, Japanese Unexamined Patent Publication No. 2007-207349, or Japanese Unexamined Patent Publication No. 2008-130106, is used.

A magnetic head, which is not shown, is mounted on the head slider 27. The mounting of the magnetic head allows a terminal portion, which is not shown, of the magnetic head to be electrically connected with the magnetic-head-side connecting terminal portion 17.

The hard disk drive mounted with the magnetic head, the head slider 27, the suspension board with circuit 1, and the external circuit board 2 can adopt the optical assist system.

In this hard disk drive, for example, the hard disk 26 travels relatively to the near-field light generation member 35 and the magnetic head. Then, a light emitted from the light emitting device 20 passes through the optical waveguide 19, and an optical path of the light is deflected upward on the end face 21. Subsequently, the resulting light is introduced into the second optical waveguide 34, and near-field light generated by the near-field light generation member 35 is applied to the surface of the hard disk 26 which is opposed to the upper side of the near-field light generation member 35. Then, the application of the near-field light from the near-field light generation member 35 heats the surface of the hard disk 26. In such state, a magnetic field is applied from the magnetic head, whereby information is recorded on the hard disk 26. At the time, the coercive force of the hard disk 26 is reduced, so that the information can be recorded on the hard disk 26 at high density by applying a small magnetic field.

In the suspension board with circuit 1, the optical waveguide 19 used in the optical assist system is provided on the metal supporting board 11 separately from the insulating base layer 12, the conductive pattern 13, and the insulating cover layer 14. Therefore, the optical waveguide 19 used in such system can be formed with more sufficient space than the head slider 27 that is formed smaller than the suspension board with circuit 1.

In particular, the optical waveguide 19 is provided on the upper surface of the metal supporting board 11 having more sufficient space than the head slider 27, so that the designing flexibility can be ensured, production efficiency can be improved, and reduction of production cost can be achieved.

Further, since the optical waveguide 19 is provided on the metal supporting board 11 separately from the insulating base layer 12 and the insulating cover layer 14, the suspension board with circuit 1, or in particular, the region for forming the optical waveguide 19 in the suspension board with circuit 1 can be made thinner. Specifically, the upper surface of the optical waveguide 19 can be made lower than the upper surface of the insulating cover layer 14.

Therefore, when the suspension board with circuit 1 is mounted on a block E (not shown), the optical waveguide 19 is protected (guarded) with the insulating cover layer 14, so that contact of the optical waveguide 19 with the block E can be effectively prevented, thereby effectively preventing damage or break in the optical waveguide 19.

Since the suspension board with circuit 1 includes the light emitting device 20 and the light emitting device 20 is optically connected with the optical waveguide 19, the light emitting device 20 and the optical waveguide 19 can be provided together on the upper surface of the metal supporting board 11. This can improve reliability of optical connection, thereby allowing to reliably perform the optical assist system.

Further, since the suspension board with circuit 1 includes the mounting portion 9, the head slider 27 can be securely mounted.

In the suspension board with circuit 1, the light emitting device 20 is arranged on the rear end side thereof, that is, on the rear end side of the wire portion 3, while the mounting portion 9 is arranged on the front end side thereof, that is, in a tongue portion 6 of the gimbal portion 4. Thus, the designing flexibility of the layout of the light emitting device 20 and the head slider 27 can be reliably ensured.

In the above description, the optical waveguide 19 is spaced apart from the insulating base layer 12 and the insulating cover layer 14. However, for example, it may be provided adjacent to the insulating base layer 12 and the insulating cover layer 14, though not shown. That is, in this case, one side surfaces of the insulating base layer 12 and the insulating cover layer 14 may be brought into contact with the other side surface of the optical waveguide 19.

In the above description, one optical waveguide 19 is provided on the suspension board with circuit 1. However, the number is not particularly limited thereto and, for example, although not shown, a plurality of optical waveguides 19 may be provided depending on the application and purpose of the suspension board with circuit 1.

Further, in the method for producing the suspension board with circuit 1 shown in FIGS. 4(b) and 4(c) described above, the insulating base layer 12, the conductive pattern 13, and the insulating cover layer 14 are first formed and then, the optical waveguide 19 is formed. However, the order of forming these layers is not particularly limited thereto and, for example, although not shown, the optical waveguide 19 may be first formed on the upper surface of the metal supporting board 11 as shown in FIG. 4(c) and then, the insulating base layer 12, the conductive pattern 13, and the insulating cover layer 14 may be formed on the upper surface of the metal supporting board 11 exposed from the optical waveguide 19, as shown in FIG. 4(b).

In the above description, the over clad layer 24 is provided so as to cover the core layer 23. However, for example, although not shown, the over clad layer 24 may not be provided, thereby exposing the core layer 23. More specifically, the core layer 23 may be exposed to air to serve as a so-called air clad. Preferably, the over clad layer 24 is provided from the viewpoint of preventing the core layer 23 from damage of an external factor.

Further, instead of the under clad layer 22 or the over clad layer 24, a light reflection layer made of a metal thin layer may be provided.

Figure 6:
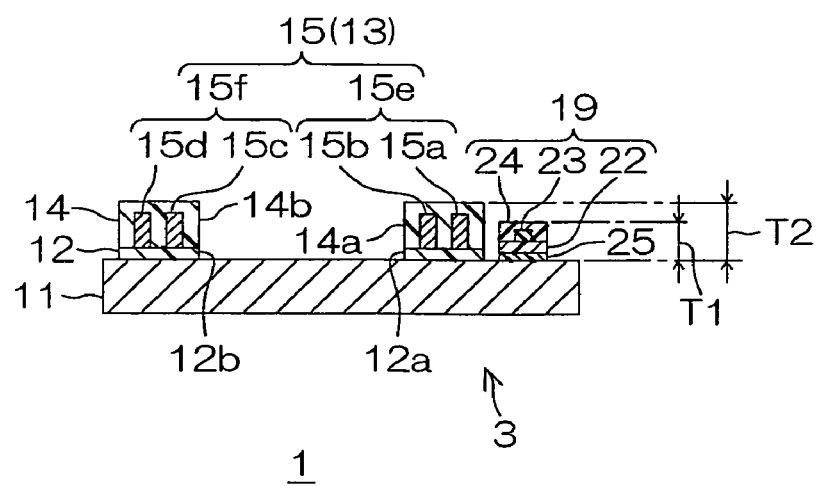
FIG. 6 is a sectional view of the wire section of the suspension board with circuit shown in FIG. 1 taken along the widthwise direction, illustrating an embodiment in which the optical waveguide is laminated on the upper surface of the metal supporting board via an adhesive layer.

FIG. 6 is a sectional view of the wire section of the suspension board with circuit shown in FIG. 1 taken along the widthwise direction, illustrating an embodiment in which the optical waveguide is laminated on the upper surface of the metal supporting board via an adhesive layer and FIG. 7 is a sectional view illustrating the steps of producing the suspension board with circuit shown in FIG. 6. The same reference numerals are provided in each of the subsequent figures for members corresponding to each of those described above, and their detailed description is omitted.

In the above description, the optical waveguide 19 is directly provided on the upper surface of the metal supporting board 11. However, for example, the optical waveguide 19 may be provided thereon via an adhesive layer 25.

In FIG. 6, the adhesive layer 25 is interposed between the metal supporting board 11 and the under clad layer 22 in the thickness direction. Specifically, the adhesive layer 25 is in contact with the upper surface of the metal supporting board 11 and the undersurface of the under clad layer 22.

The adhesive layer 25 is formed in generally the same shape in plane view as the shape of the optical waveguide 19 in plane view. That is, the peripheral end edge of the adhesive layer 25 is formed so as to be in generally the same position in plane view as the peripheral end edge (both widthwise end edges and both lengthwise end edges) of the optical waveguide 19 (the under clad layer 22).

To produce the suspension board with circuit 1, the metal supporting board 11 is first prepared as shown in FIG. 7(a), and then, the insulating base layer 12, the conductive pattern 13, and the insulating cover layer 14 are sequentially laminated on the metal supporting board 11 as shown in FIG. 7(b).

Then, as shown in FIG. 7(c), the optical waveguide 19 is separately prepared.

To prepare the optical waveguide 19, the under clad layer 22, the core layer 23, and the over clad layer 24 are sequentially laminated on a release sheet such as a polyethylene terephthalate (PET) sheet which is not shown. Subsequently, the optical waveguide 19 is removed from the release sheet.

To sequentially laminate these layers, the under clad layer 22 is first formed on a release sheet. To form the under clad layer 22, for example, a varnish (resin solution) of any of the above-mentioned resins is prepared, the varnish thus prepared is applied to the upper surface of the release sheet. Thereafter, the applied varnish is dried, and is then cured as required.

Subsequently, the core layer 23 is formed on the upper surface of the under clad layer 22. To form the core layer 23, for example, a varnish (resin solution) of any of the above-mentioned resins is prepared, the varnish thus prepared is applied to the upper surface of the release sheet including the under clad layer 22. Thereafter, the applied varnish is dried, and is then cured as required.

Subsequently, the over clad layer 24 is formed on the under clad layer 22 so as to cover the core layer 23. To form the over clad layer 24, for example, a varnish (resin solution) of any of the above-mentioned resins is prepared, the varnish thus prepared is applied to the upper surface of the release sheet including the core layer 23 and the under clad layer 22. Thereafter, the applied varnish is dried, and is then cured as required.

Thus, the under clad layer 22, the core layer 23, and the over clad layer 24 are sequentially laminated on the release sheet, whereby the optical waveguide 19 including these layers can be prepared.

Subsequently, in this method, as indicated by the arrow in FIG. 7(*c*) and shown in FIG. 7(*d*), the optical waveguide 19 is adhered onto the metal supporting board 11 via the adhesive layer 25. Specifically, the under clad layer 22 is adhered to the metal supporting board 11 via the adhesive layer 25.

To adhere the optical waveguide 19 onto the metal supporting board 11 via the adhesive layer 25, as shown in FIG. 7(*c*), the adhesive layer 25 is first laminated (adhesively bonded) to the (under) surface of the under clad layer 22. The adhesive for forming the adhesive layer 25 is not particularly limited, and for example, a polyimide adhesive, an epoxy adhesive, or the like may be used.

The thickness of the adhesive layer 25 is set so that the upper surface of the optical waveguide 19 is lower than the upper surface of the insulating cover layer 14. Specifically, the adhesive layer 25 has a thickness in the range of, for example, 3 to 30 µm, or preferably 5 to 20 µm.

Then, as shown in FIG. 7(*d*), the adhesive layer 25 is brought in contact with the upper surface of the metal supporting board 11.

Therefore, the under clad layer 22 can be adhered to the metal supporting board 11 via the adhesive layer 25, that is, the optical waveguide 19 can be adhered to the upper surface of the metal supporting board 11 via the adhesive layer 25.

Thus, the optical waveguide 19 is laminated on the upper surface of the metal supporting board 11 via the adhesive layer 25, whereby the optical waveguide 19 can be conveniently positioned on the metal supporting board 11. This can achieve reduction of production cost.

In the method for producing the suspension board with circuit 1 shown in FIG. 7(*c*) described above, the adhesive layer 25 is first laminated on the undersurface of the under clad layer 22. However, for example, although not shown, the adhesive layer 25 may be first laminated on the upper surface of the metal supporting board 11, and then, the under clad layer 22 may be adhered onto the metal supporting board 11 using the adhesive layer 25.

Further, in the above description, the optical waveguide 19 is adhered via the adhesive layer 25. However, for example, although not shown, when the under clad layer 22 has an adhesive strength, the adhesive layer 25 may not be necessarily provided. That is, the under clad layer 22 also serves as the adhesive layer.

In this case, as the material for forming the under clad layer 22, polyimide resin is preferably used, and as the material for forming the core layer 23 and the over clad layer 24, polyimide resin is also preferably used from the viewpoint of adhesion between these layers and the under clad layer 22.

To adhere the under clad layer 22 to the upper surface of the metal supporting board 11, as shown in FIGS. 7(*c*) and 7(*d*), for example, the under clad layer 22 is thermocompression-bonded to the upper surface of the metal supporting board 11.

Figure 8:
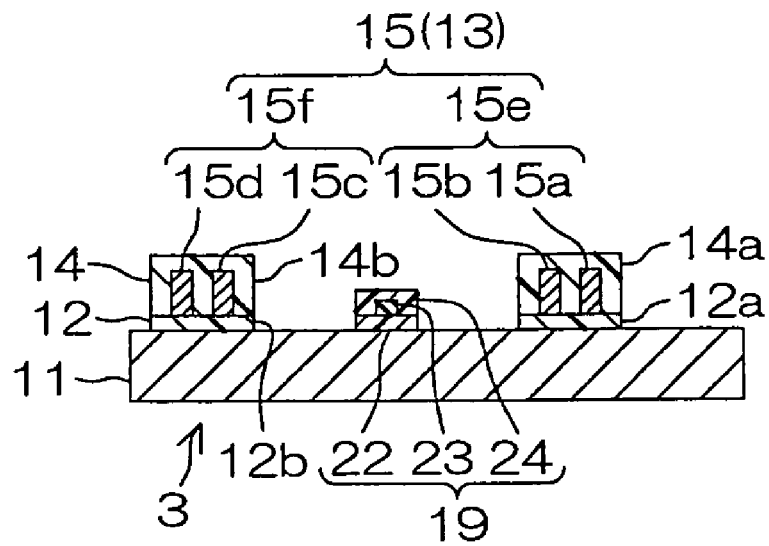
FIG. 8 is a sectional view of the wire section of the suspension board with circuit shown in FIG. 1 taken along the widthwise direction, illustrating an embodiment in which the optical waveguide is provided between a first insulating base layer and a first insulating cover layer, and a second insulating base layer and a second insulating cover layer.

FIG. 8 is a sectional view of the wire section of the suspension board with circuit shown in FIG. 1 taken along the widthwise direction, illustrating an embodiment in which the optical waveguide is provided between a first insulating base layer and a first insulating cover layer, and a second insulating base layer and a second insulating cover layer.

In the above description, the optical waveguide 19 is provided on one side of the first insulating base layer 12*a* and the first insulating cover layer 14*a*. The arrangement of the optical waveguide 19 is not be particularly limited as long as the optical waveguide 19 is arranged in any region on the upper surface of the metal supporting board 11, except portions where the insulating base layer 12 and the insulating cover layer 14 are formed. For example, as shown in FIG. 8, the optical waveguide 19 may be provided between the first insulating base layer 12*a* and the first insulating cover layer 14*a*, and the second insulating base layer 12*b* and the second insulating cover layer 14*b*.

In FIG. 8, the optical waveguide 19 is formed in generally the middle of (partway) the wire portion 3 in plane view between the first insulating base layer 12*a* and the first insulating cover layer 14*a*, and the second insulating base layer 12*b* and the second insulating cover layer 14*b*. That is, the optical waveguide 19 is formed at spaced intervals to the first insulating base layer 12*a* and the first insulating cover layer 14*a*, and to the second insulating base layer 12*b* and the second insulating cover layer 14*b*, respectively.

Accordingly, the optical waveguide 19 can be provided between the first insulating base layer 12*a* and the first insulating cover layer 14*a*, and the second insulating base layer 12*b* and the second insulating cover layer 14*b*, whereby even though there is not sufficient space left on one side of the first insulating base layer 12*a* and the first insulating cover layer 14*a*, the optical waveguide 19 can be provided therebetween.

Therefore, the flexibility of designing of the optical waveguide 19 can be further improved.

Further, the optical waveguide 19 can be provided on the other side of the second insulating base layer 12*b* and the second insulating cover layer 14*b*, that is, on the opposite side of the second insulating base layer 12*b* and the second insulating cover layer 14*b* with respect to the first insulating base layer 12*a* and the first insulating cover layer 14*a*, though not shown.

Figure 9:
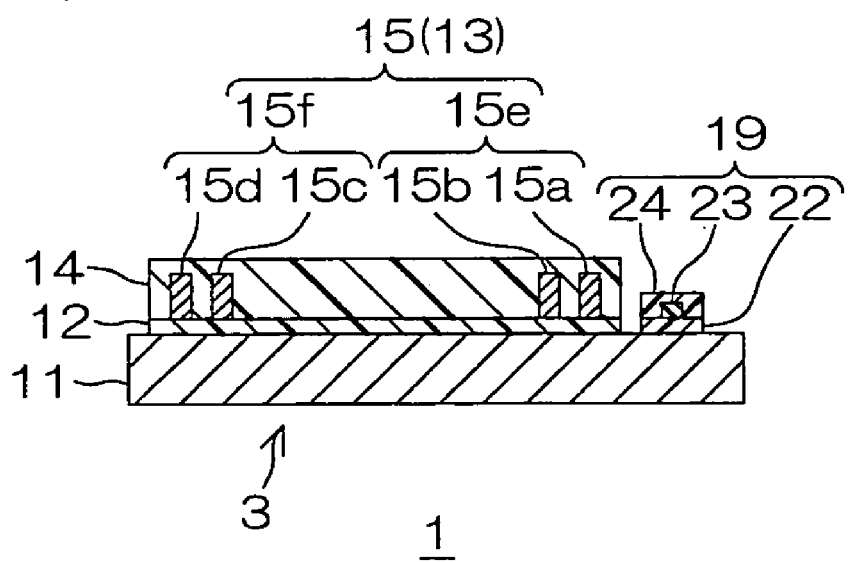
FIG. 9 is a sectional view of the wire section of the suspension board with circuit shown in FIG. 1 taken along the widthwise direction, illustrating an embodiment in which the insulating base layer and the insulating cover layer are formed in the form of one continuous insulating base layer and one continuous insulating cover layer, respectively.

Further, in the above description, the insulating base layer 12 is formed from two insulating base layers, and the insulating cover layer 14 is formed as two insulating cover layers. However, for example, as shown in FIG. 9, when projected in the thickness direction, the insulating base layer 12 may be formed in the form of one continuous insulating base layer so as to collectively contain four wires 15, and the insulating cover layer 14 may be formed in the form of one continuous insulating cover layer so as to collectively cover four wires 15.

EXAMPLES

While in the following, the present invention is described in further detail with reference to Examples, the present invention is not limited to any of them by no means.

Example 1

(Embodiment in which Optical Waveguide is Directly Laminated on the Upper Surface of Metal Supporting Board)

A metal supporting board made of a 20 μm thick stainless steel was prepared (cf. FIG. 4(a)).

Then, an insulating base layer and a pedestal insulating base layer both made of polyimide resin were simultaneously formed on the metal supporting board in the above-mentioned pattern. That is, an insulating base layer having a first insulating base layer and a second insulating base layer which are opposed at a spaced interval to each other in the width direction was formed. The insulating base layer and the pedestal insulating base layer thus formed each had a thickness of 15 μm.

Subsequently, a conductive pattern, a pedestal conductive layer, a supply wire and a supply terminal portion, all made of copper, were simultaneously formed by an additive method. That is, a first pair of wires were formed on the first insulating base layer, and a second pair of wires were formed on the second insulating base layer. These had a thickness of 12 μm.

Then, an insulating cover layer made of polyimide resin was formed on the insulating base layer in the above-mentioned pattern. That is, a first insulating cover layer was formed on the first insulating base layer so as to cover the first pair of wires, and a second insulating cover layer was formed on the second insulating base layer so as to cover the second pair of wires. The insulating cover layer had a thickness of 8 μm. Thus, the insulating base layer, the conductive pattern, and the insulating cover layer were sequentially laminated on the metal supporting board (cf. FIG. 4(b)). In addition, the insulating base layer and the insulating cover layer were arranged so as to reserve a region for forming an optical waveguide in the following step.

The thickness (T2) from the upper surface of the metal supporting board to the upper surface of the insulating cover layer was 35 μm.

Then, an optical waveguide was formed on the metal supporting board. To form the optical waveguide, an under clad layer was first formed.

To form the under clad layer in the above-mentioned pattern, first, 35 parts by weight of bisphenoxyethanolfluorene diglycidyl ether (fluorene derivative, epoxy equivalent: 300 g/eq.), 25 parts by weight of alicyclic epoxy resin having a cyclohexene oxide structure (CELLOXIDE 2081, commercially available from DAICEL CHEMICAL INDUSTRIES, LTD.), 2 parts by weight of 50% propionic carbonate solution of 4,4-bis[di(β-hydroxyethoxy)phenylsulfinio]phenylsulfide-bis-hexafluoroantimonate (photosensitizer), and 40 parts by weight of 3,4-epoxycyclohexenylmethyl-3',4'-epoxycyclohexenecarboxylate(diluent, alicyclic epoxy, CELLOXIDE 2021P, commercially available from DAICEL CHEMICAL INDUSTRIES, LTD.) were mixed to prepare a varnish. Subsequently, the varnish was applied to the upper surface of the metal supporting board, and was then dried by heating the applied varnish at 80° C. for 15 minutes. Thereafter, the varnish thus dried was exposed to light via a photomask, and was then developed by dissolving an unexposed portion of the varnish with a gamma-butyrolactone organic solvent. Then, the varnish thus developed was heated at 100° C. for 15 minutes to be cured, thereby forming an under clad layer on the upper surface of the metal supporting board.

The under clad layer (after curing) had a refractive index of 1.540 at a wavelength of 830 nm. Further, the under clad layer had a thickness of 10 μm and a width of 30 μm.

Next, a core layer was formed on the upper surface of the under clad layer.

To form the core layer in the above-mentioned pattern, first, 70 parts by weight of bisphenoxyethanolfluorene diglycidyl ether (fluorene derivative, epoxy equivalent: 300 g/eq.), 30 parts by weight of 1,1,1-tris{4-[2-(3-oxetanyl)] butoxy phenyl}ethane (oxetane compound), 1 part by weight of a 50% propionic carbonate solution of 4,4-bis[di(β-hydroxyethoxy)phenylsulfinio] phenylsulfide-bis-hexafluoroantimonate (photosensitizer), and 30 parts by weight of ethyl lactate (diluent) were mixed to prepare a varnish. Subsequently, the varnish was applied to the upper surface of the metal supporting board including the under clad layer, and was then dried by heating the applied varnish at 80° C. for 15 minutes. Thereafter, the varnish thus heated was exposed to light via a photomask, and was then developed by dissolving an unexposed portion of the varnish with a gamma-butyrolactone organic solvent. Then, the varnish thus developed was heated at 100° C. for 15 minutes to be cured, thereby forming a core layer on the under clad layer.

The core layer (after curing) had a refractive index of 1.594 at a wavelength of 830 nm. Further, the core layer had a thickness of 5 μm and a width of 5 μm.

Next, an over clad layer was formed on the upper surface of the under clad layer so as to cover the core layer.

To form the over clad layer in the above-mentioned pattern, the same varnish as that for forming the above-mentioned under clad layer was first prepared. Subsequently, the varnish was applied to the upper surface of the metal supporting board including the core layer and the under clad layer, and was then dried by heating the applied varnish at 80° C. for 15 minutes. Thereafter, the varnish thus dried was exposed to light via a photomask, and was then developed by dissolving an unexposed portion of the varnish with a gamma-butyrolactone organic solvent. Then, the varnish thus developed was heated at 100° C. for 15 minutes to be cured, thereby forming an over clad layer on the under clad layer so as to cover the core layer.

The over clad layer (after curing) had a refractive index of 1.540 at a wavelength of 830 nm. Further, the over clad layer had a thickness from the upper surface of the core layer of 10 μm and a width of 30 μm.

Thus, the optical waveguide was directly formed on the upper surface of the metal supporting board so as to be spaced apart from the insulating base layer and the insulating cover layer (cf. FIG. 4(c)). More particularly, the optical waveguide was formed on one side of the first insulating base layer and the first insulating cover layer so as to be spaced apart from these layers.

In addition, the thickness (from the upper surface of the metal supporting board to the upper surface of the over clad layer) (T1) of the optical waveguide was 25 μm. That is, the upper surface of the optical waveguide was lower than the upper surface of the insulating cover layer.

Next, an opening having a rectangular shape in plane view was formed in the metal supporting board in a terminal forming portion by wet etching (cf. FIG. 4(d)). The opening had a width of 100 μm and a length of 100 μm.

Subsequently, the optical waveguide was cut at a time from the opening side by laser machining so that the end face of the front end portion of the optical waveguide intersected the lengthwise direction (cf. FIG. 4(e)). The end face of the optical waveguide thus formed by the cutting had a tilt angle of 45°.

Thereafter, on the rear end side of a wire portion on the suspension board with circuit, a light emitting device was disposed on the upper surface of the metal supporting board so as to be optically connected to the rear end of the optical waveguide and be electrically connected to the front end of the supply wire (cf. FIGS. 1 and 2).

Example 2

(Embodiment in which Optical Waveguide is Laminated on the Upper Surface of Metal Supporting Board via Adhesive Layer)

The suspension board with circuit was obtained in the same manner as in Example 1 except that the optical waveguide was separately prepared and was subsequently adhered to the upper surface of the metal supporting board via the adhesive layer (cf. FIGS. 6 and 7).

That is, in the step of preparing the optical waveguide, the under clad layer, the core layer, and the over clad layer were sequentially laminated on a PET sheet (cf. FIG. 7(c)).

Specifically, the same varnish for the under clad layer as that used in Example 1 was first applied to the upper surface of the PET sheet, and then the under clad layer was formed on the upper surface of the PET sheet in the same manner as in Example 1.

Subsequently, the same varnish for the core layer as that used in Example 1 was applied to the upper surface of the PET sheet including the under clad layer, and the core layer was formed on the under clad layer in the same manner as in Example 1.

Then, the same varnish for the over clad layer as that used in Example 1 was applied to the upper surface of the PET sheet including the core layer and the under clad layer, and the over clad layer was formed on the under clad layer so as to cover the core layer in the same manner as in Example 1.

Thereafter, the optical waveguide was removed from a release sheet, and an 8 μm thick adhesive layer formed from the epoxy adhesive was laminated on the undersurface of the under clad layer.

The under clad layer was adhered to the upper surface of the metal supporting board via the adhesive layer (cf. FIG. 7(d)).

The total thickness of the optical waveguide and the adhesive layer, that is, the thickness (T1) from the upper surface of the metal supporting board to the upper surface of the over clad layer was 33 μm.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A suspension board with circuit comprising:
   a metal supporting board;
   an insulating base layer formed on an upper surface of the metal supporting board such that a formation region where an optical waveguide is to be formed is ensured on the metal supporting board;
   a conductive pattern formed on the insulating base layer;
   an insulating cover layer formed on the insulating base layer so as to cover the conductive pattern;
   the optical waveguide;
   a light emitting device; and
   a near-field light generation member,
   wherein the metal supporting board is provided with a magnetic head in a hard disk drive, and supports the magnetic head against an airflow caused when the magnetic head and a hard disk travel relatively to each other, while holding a minute gap between the magnetic head and the hard disk;
   the conductive pattern is formed on the insulating base layer for connecting an external circuit board and the magnetic head;
   the optical waveguide is optically connected to the light emitting device and the near-field light generation member;
   the light emitting device is a light source for allowing light to enter the optical waveguide, and the light emitting device is disposed on the metal supporting board at a location spaced apart from the magnetic head;
   the near-field light generation member is provided in order to allow near-field light to generate from the light emitted from the optical waveguide, and then apply the near-field light onto the surface of the hard disk to thereby heat a minute region of the surface thereof; and
   the optical waveguide is provided in the formation region directly on the upper surface of the metal supporting board separately from the insulating base layer, the conductive pattern, and the insulating cover layer, such that the optical waveguide extends along a direction in which the conductive pattern extends and is spaced apart from the insulating base layer, the conductive pattern, and the insulating cover layer.

2. The suspension board with circuit according to claim 1, wherein the upper surface of the optical waveguide is lower than the upper surface of the insulating cover layer.

3. The suspension board with circuit according to claim 1, wherein
   the optical waveguide comprises
      an under clad layer;
      a core layer formed on the under clad layer and having a higher refractive index than that of the under clad layer; and
      an over clad layer formed on the under clad layer so as to cover the core layer and having a lower refractive index than that of the core layer, and
   the under clad layer is directly laminated on the upper surface of the metal supporting board.

4. The suspension board with circuit according to claim 1, wherein
   the optical waveguide comprises:
      an under clad layer;
      a core layer formed on the under clad layer and having a higher refractive index than that of the under clad layer; and
      an over clad layer formed on the under clad layer so as to cover the core layer and having a lower refractive index than that of the core layer, and
   the under clad layer is laminated on the upper surface of the metal supporting board via an adhesive layer.

5. The suspension board with circuit according to claim 1, further comprising a mounting portion for mounting a head slider, wherein
   the light emitting device is arranged on one side in a lengthwise direction of the metal supporting board, and
   the mounting portion is arranged on the other side in the lengthwise direction of the metal supporting board.

6. A method for producing a suspension board with circuit, comprising the steps of:
   preparing a metal supporting board, the metal supporting board being provided with a magnetic head in a hard disk drive, and supporting the magnetic head against an airflow caused when the magnetic head and a hard disk travel relatively to each other, while holding a minute gap between the magnetic head and the hard disk, forming an insulating base layer formed on an upper surface of the metal supporting board such that a formation region where an optical waveguide is to be formed is ensured on the metal supporting board, forming a conductive pattern for connecting an external circuit board and the magnetic head formed on the insulating base layer, and forming an insulating cover layer formed on the insulating base layer so as to cover the conductive pattern;

providing the optical waveguide in the formation region directly on the upper surface of the metal supporting board separately from the insulating base layer, the conductive pattern, and the insulating cover layer, such that the optical waveguide extends along a direction in which the conductive pattern extends and is spaced apart from the insulating base layer, the conductive pattern, and the insulating cover layer;

providing a light emitting device optically connected to the optical waveguide in order to allow light to enter the optical waveguide, the light emitting device being disposed on the metal supporting board at a location spaced apart from the magnetic head; and providing a near-field light generation member optically connected to the optical waveguide in order to allow near-field light to generate from the light emitted from the optical waveguide, and then apply the near-field light onto the surface of the hard disk to thereby heat a minute region on the surface thereof.

* * * * *